United States Patent [19]
Mito et al.

[11] Patent Number: 4,751,719
[45] Date of Patent: Jun. 14, 1988

[54] DISTRIBUTED FEEDBACK SEMICONDUCTOR LASER DEVICE

[75] Inventors: Ikuo Mito; Masayuki Yamaguchi, both of Tokyo, Japan

[73] Assignee: NEC Corporation, Tokyo, Japan

[21] Appl. No.: 872,726

[22] Filed: Jun. 10, 1986

[30] Foreign Application Priority Data

Jun. 10, 1985 [JP] Japan .................. 60-125449
Dec. 13, 1985 [JP] Japan .................. 60-280342

[51] Int. Cl.$^4$ .............................. H01S 3/19
[52] U.S. Cl. ........................ 372/96; 372/32; 372/46
[58] Field of Search ............. 372/50, 46, 29, 32

[56] References Cited

U.S. PATENT DOCUMENTS

| | | | |
|---|---|---|---|
| 4,475,200 | 10/1984 | Lee | 372/46 |
| 4,573,158 | 2/1986 | Utaka et al. | 372/96 |
| 4,665,528 | 5/1987 | Chinone et al. | 372/96 |

OTHER PUBLICATIONS

Utoka et al., "λ/4 Shifted...", *Electronics Letters,* vol. 20, No. 24, Nov. 22, 1984, pp. 1008–1009.
Mito et al., "InGaAsP Double-Channel-Planar-Buried-Heterostructure Lase Diode...", *Journal of Lightwave Technology,* vol. LT-1, No. 1, Mar. 1983, pp. 195–202.
Yamaguchi et al., "Wide Range Wavelength Tuning in 1.3 μm DBR-DC-PBH-LDs...", *Electronics Letters,* vol. 21, No. 2, Jan. 17, 1985, pp. 63–65.

*Primary Examiner*—James W. Davie
*Attorney, Agent, or Firm*—Sughrue, Mion, Zinn, Macpeak, and Seas

[57] ABSTRACT

Laser chips which are stably operated in a single mode result from a semiconductor laser device in which a diffraction grating is formed neighboring an active layer. The distribution of current to be injected into the active layer is controlled to a configuration which substantially corresponds to that of the distribution of the field intensity of light along the laser optical axis inside the active layer.

12 Claims, 4 Drawing Sheets

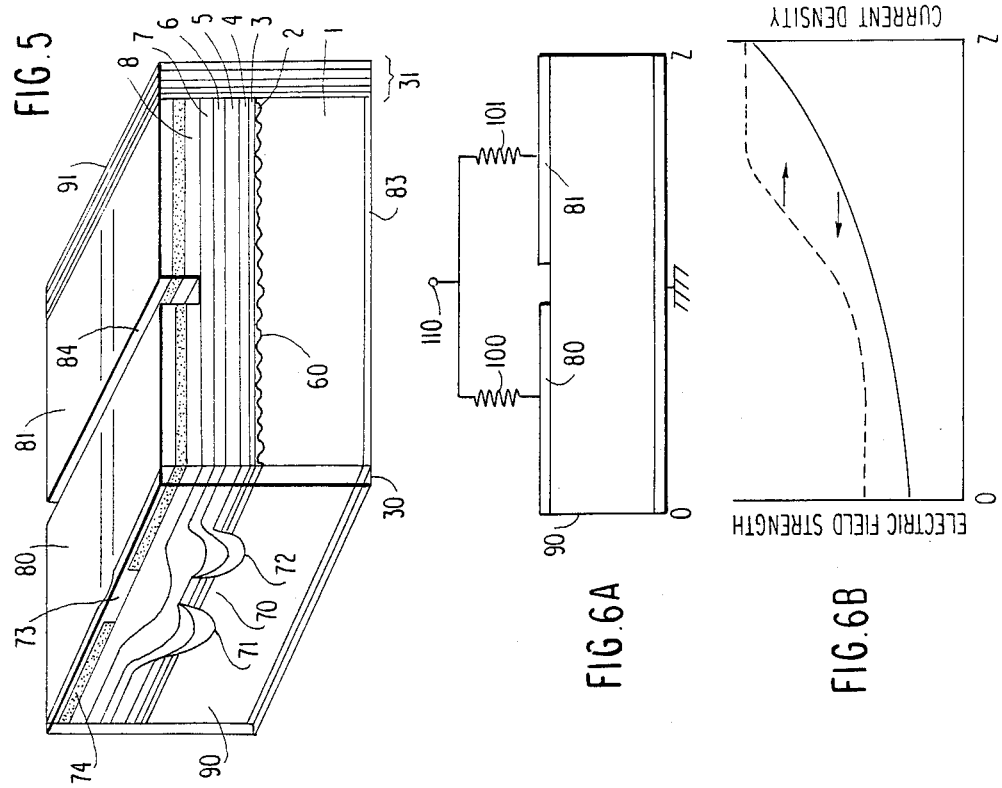
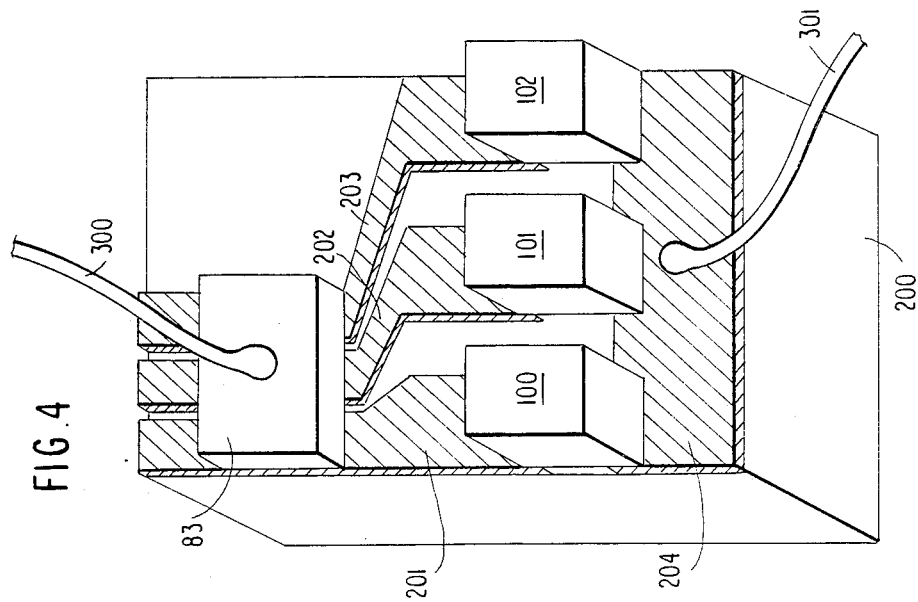

DISTRIBUTED FEEDBACK SEMICONDUCTOR LASER DEVICE

BACKGROUND OF THE INVENTION

The present invention relates to a semiconductor laser device usable as, for example, a light source for optical communications, optical measuring apparatuses and the like.

A distributed feedback laser diode (DFBLD) or a distributed Bragg reflector laser diode (DBRLD) which is operable in a single mode is a promising light source for high-speed and long-distance optical fiber communications Due to its good single mode purity of lasing wavelength, this laser is also suitable for use in optical measuring apparatus in which a coherent optical arrangement is built in. Indeed, in an experimental optical fiber communication system having a data rate as high as 4 Gb/s and a transmission distance of longer than 100 kg, a DFBLD using an InGaAsP/InP material has been used as a light source and has proven to be effective. Further, it has been found that a device with good characteristics exhibits in a single mode a high output CW operation (above 100 mW) and high temperature CW operation (as high as 140° C.), which are comparable with the characteristics of a conventional Fabry-Perot type semiconductor laser. However, a DFBLD, unlike a Fabry-Perot type laser, cannot readily be provided with a structure which allows it to lase in single mode. Specifically, Fabry-Perot type laser devices which substantially satisfy necessary conditions can be produced with stability only if the transverse mode is controlled. With the DFBLD, however, the lasing spectrum varies in a complicated manner between the single mode and plural modes depending upon various factors such as the particular diffraction grating phase at which the diffraction grating is terminated at the emitting end of the DFBLD, making it difficult to produce devices that are stably operable in a single mode at a high yield.

SUMMARY OF THE INVENTION

It is therefore an object of the present invention to provide a semiconductor laser device which is operable in a stable single mode and producible at a high yield.

In accordance with the present invention, there is provided a semiconductor laser device in which a diffraction grating is formed neighboring an active layer, and the distribution of current to be injected into the active layer is controlled to a configuration which substantially corresponds to that of the distribution of the field intensity of light along the laser optical axis within the active layer.

By controlling the current distribution configuration as stated above, the present invention remarkably enhances the yield of laser chips which are stably operable in a single mode.

BRIEF DESCRIPTION OF THE DRAWINGS

FIG. 4 is a perspective view of a second embodiment of the present invention;

FIG. 5 is a perspective view of a semiconductor laser usable in a third embodiment of the present invention;

FIG. 6A shows the laser of FIG. 5 to which load resistors are interconnected;

FIG. 6B is the plot showing a distribution of field intensity of light and that of current density in the axial direction of a resonator as are attainable with the arrangement of FIG. 6A;

PRINCIPLE OF THE PRESENT INVENTION

Before entering into a detailed description of the preferred embodiments of the present invention, the principle of the present invention will be briefly described.

Figure 1A:
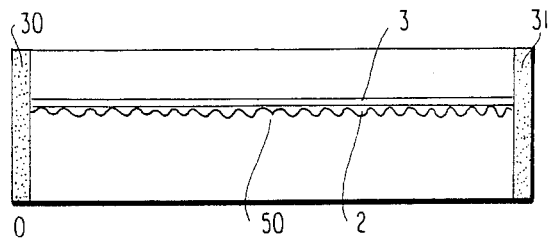
FIG. 1A is a section of a prior art DFBLD useful for describing the principle of the present invention.

Referring to FIG. 1A, a typical exmple of DFBLD structure is schematically shown. It has been reported that a DFBLD providing a $\lambda/4$-shifted region 50, which changes the phase of the diffraction grating by a quarter-wave in terms of Bragg wavelength, at substantially the center of a laser chip has been successful in improving the single-mode lasing characteristic (e.g., "$\lambda/4$-Shifted InGaAsP/InP DFB Lasers by Simultaneous Holographic Exposure of Positive and Negative Photoresists", ELECTRONICS LETTERS, 22nd November 1984 Vol. 20, No. 24). The DFBLD shown in FIG. 1A has such a structure. Low-reflectivity films 30 and 31 are respectively formed on opposite end facets of the DFBLD to eliminate the influence of reflections otherwise caused by those facets. Among those modes which arise in the resonator of the DFBLD having the structure of FIG. 1A, that which oscillates at the Bragg frequency and has the lowest lasing threshold exhibits a field intensity distribution as plotted in FIG. 1B. The distribution shown is a result of a calculation performed assuming that current injection is effected in a direction perpendicular to the axis of the resonator and uniformly throughout various points in the axial direction of the semiconductor, and that the gains at the respective points are the same. As shown, the field intensity is greatest at the $\lambda/4$-shifted region 50 which is located at the center of the element, and is sequentially attenuated toward the opposite ends. An element provided with the region 50 therein provides excellent results because it oscillates at the Bragg wavelength to allow a substantial difference in lasing threshold gain to be set up between the mode which oscillates at the Bragg wavelength and any other modes.

Figure 1B:
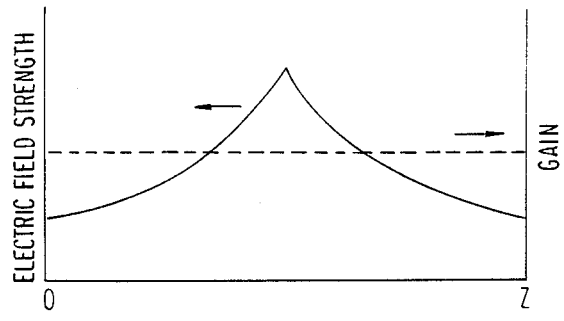
FIGS. 1B to 1D are plots representative of distributions of field intensity of the light and gain in an axial direction of a resonator, and are also useful for describing the principle of the present invention.
Figure 1C:
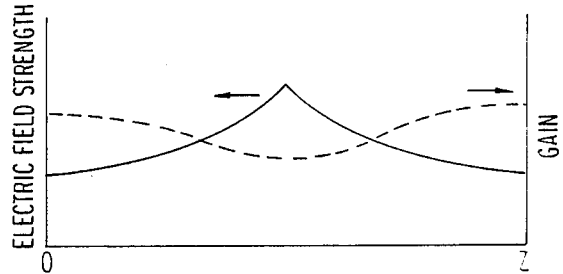

The curve of FIG. 1B was obtained on the assumption that the gains are uniform along the axis of the resonator. In practice, however, at substantially the center of the resonator the field intensity of light is high and, therefore, a greater number of injected carriers are consumed resulting in gain saturation. Taking this into account, the field intensity distribution and the gain distribution which actually occur are such that, as shown in FIG. 1C, the field intensity is somewhat lower at the center than is the case in FIG. 1B. Where the injection current is increased, the field intensity of light inside the resonator is further increased promoting the tendency of the consumption of injected carriers at and near the center of the resonator to be increased. Conversely, the gain at opposite ends of the resonator where carrier consumption is less than at the center is also increased. As a result, sub-modes exhibiting a field intensity distribution which, unlike that of the mode which oscillates at the Bragg wavelength, increases at opposite ends of the resonator, become more and more liable to oscillate. Finally, the sub-modes begin to oscillate along with the mode which oscillates at the Bragg wavelength or after the latter mode has stopped oscillating. Heretofore, such a phenomenon has not been fully understood because the conventional calculation has in most cases been based on the assumption that the gains in the resonator are uniform.

Figure 1D:
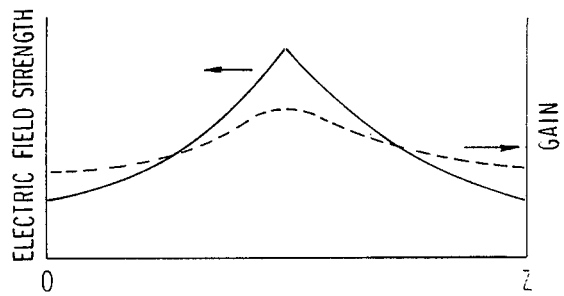

We manufactured an experimental model having a structure similar to that of FIG. 1A to evaluate its operation and found that sub-modes oscillate to a greater than expected degree. To account for this fact, it is necessary to consider the configuration of the field intensity distribution in the axial direction of the resonator. Such a problematic situation can be resolved if the distribution configuration along the axis of the resonator is controlled such that, as shown in FIG. 1D, a gain distribution is obtained which is similar in configuration to the field intensity distribution of the mode that lases at the lowest threshold. Embodiments of the present invention, described below, are characterized by a current injection distribution having a configuration corresponding to that of the field intensity distribution inside the resonator in the axial direction of the resonator.

DETAILED DESCRIPTION OF THE PREFERRED EMBODIMENTS

Figure 2:
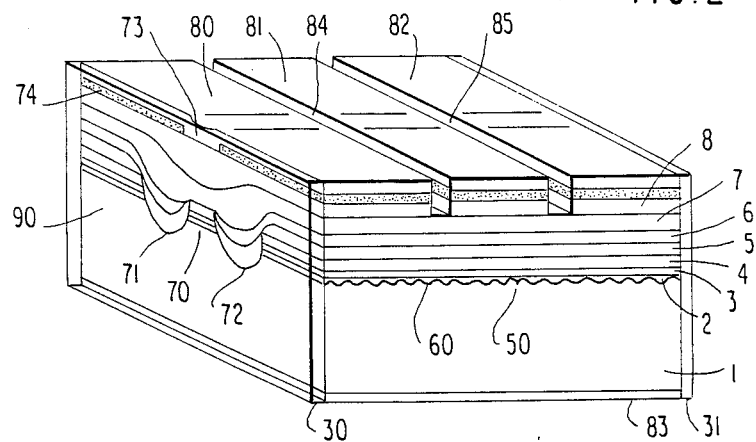
FIG. 2 is a perspective view of a semiconductor laser usable in a first embodiment of the present invention.

Referring to FIG. 2, a first embodiment of the present invention is shown in a perspective view. A diffraction grating 60 which is 1000 Å deep and has a pitch of 2000 Å is formed on a (001) n-InP substrate 1 (Sn-doped, carrier density of $1 \times 10^{18}$ cm$^{-3}$). The diffraction grating 60 has a $\lambda/4$-shifted region 50 substantially at the center of the resonator. Sequentially formed on the substrate 1 are an n-InGaAsP guide layer 2 (1.15 $\mu$m composition in terms of lasing wavelength, Sn-doped, carrier density of $7 \times 10^{17}$ cm$^{-3}$), a nondoped InGaAsP active layer 3 (1.30 $\mu$m composition in terms of lasing wavelength, 0.1 $\mu$m thick), and a p-InP cladding layer 4 (Zn-doped, carrier density of $1 \times 10^{18}$ cm$^{-3}$, 0.7 $\mu$m thick). Thereafter, two parallel grooves 71 and 72 each being 3 $\mu$m deep and about 8 $\mu$m wide are formed in the (110) direction with a mesa stripe 70 intervening therebetween, the mesa stripe 70 being about 1.5 $\mu$m wide at the top thereof. Further, a p-InP blocking layer 5 (Zn-doped, carrier density of $1 \times 10^{18}$ cm$^{-3}$, 0.5 $\mu$m thick at flat regions), and an n-InP confining layer 6 (Te-doped, carrier density of $5 \times 10^{18}$ cm$^{-3}$, 0.5 $\mu$m thick at flat regions) are grown one upon the other except for the region above the mesa stripe 70. This is followed by covering the whole area of the laminate with a p-InP embedding layer 7 (Zn-doped, carrier density of $1 \times 10^{18}$ cm$^{-3}$, 1.5 $\mu$m thick at flat regions) and a p-InGaAsp cap layer 8 (Zn-doped, carrier density of $1 \times 10^{19}$ cm$^{-3}$, and 1.0 $\mu$m thick at flat regions). This completes a double channel planar buried heterostructure wafer. An SiO$_2$ insulating film 74 is formed above the mesa stripe 70 except for an injecting region 73 which is 10 $\mu$m wide. First, second and third p-side metal electrodes 80, 81 and 82 are separated from each other by intervals 100 $\mu$m by 5 $\mu$m wide created by separating grooves 84 and 85, each of which extends through the p-InGaAsP layer 8 down to the layer 7 perpendicularly to the mesa stripe 70. An n-side metal electrode 83 implemented using AuGeNi is provided on the substrate 1 side. Cleaved facets at opposite ends of the wafer are respectively provided with films (SiN films in this particular example) 30 and 31, the reflectivity of which is lower than 2%.

When the first to third metal electrodes 80, 81 and 82 were short-circuited to measure the injection current versus light output characteristic, the lasing threshold at a temperature of 25° C. was found to be 30 mA and the differential quantum efficiency with respect to light output from the front end 90 was 20%. Concerning lasing spectra, although some laser chips successfully operated with stability up to a high output range above about 30 mW in terms of one-side output, many other chips exhibited mode hopping and lased in multiple modes at about 5 mW.

Figure 3A:
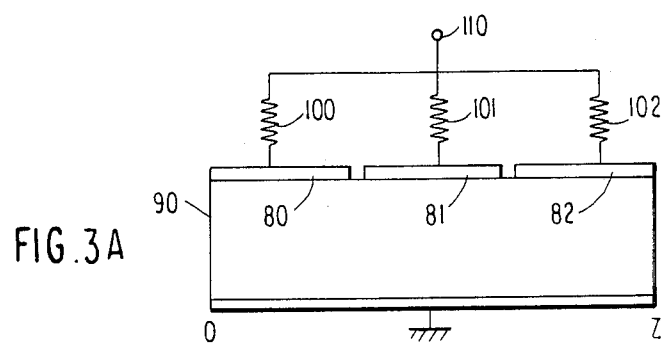
FIG. 3A shows the laser of FIG. 2 to which load resistors are interconnected.
Figure 3B:
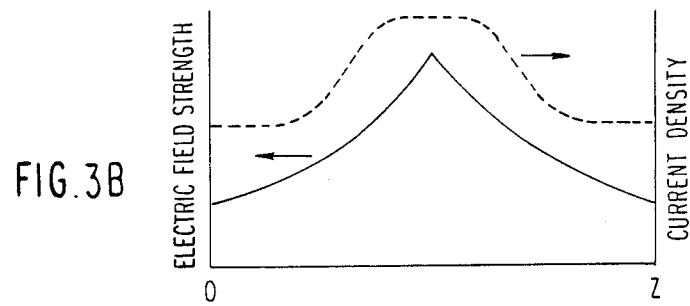
FIG. 3B is the plot showing a distribution of field intensity of light and that of current density in the axial direction of a resonator as are attainable with the arrangement of FIG. 3A.

In light of the above, as shown in FIG. 3A, load resistors 100, 101 and 102 having values of 100$\Omega$, 50$\Omega$ and 100$\Omega$, respectively, were respectively connected to the first to third p-side electrodes 80 to 82 for experimental purposes. In this arrangement, as a current is fed through terminal 100 to the laser chip, a current substantially twice greater than those through the first and third electrodes 80 and 82 flows through the second or intermediate electrode 81. This allows an injection current density distribution to be developed toward the axis of the resonator, as represented by a broken curve in FIG. 3B. At the borders between the nearby p-side electrodes, the distribution appears smoothly curved and not stepped because the electric resistance between the first to third electrodes 80, 81 and 82 is as small as about 20$\Omega$ which allows current to flow from below the second electrode 81 toward the opposite sides. The current density distribution of FIG. 3B resembles in configuration the field intensity distribution which is represented by a solid curve in FIG. 3B. Hence, the arrangement of FIG. 3A is expected to cause the laser to lase in a single mode more stably than the previously mentioned arrangement wherein the electrodes 80 to 82 are short-circuited.

Various characteristics of the laser chip were evaluated by supplying current through the terminal 110. It was proven that the laser operates in a stable single mode with a lasing threshold of 20 mA at 25° C. and up to substantially the limit of light output from the front end 90, i.e. about 50 mW. The differential quantum efficiency with respect to the light output from the facet 90 was 25%. Thus, it was proven that a chip with a current density distribution configuration approximating the internal field intensity distribution is operable in substantially a stable single mode, and that substantially 80% of such chips exhibit stable single mode operation up to 30 mW and above, thus demonstrating the effectiveness of the structure in accordance with the present invention.

Referring to FIG. 4, a second embodiment of the present invention is shown. While in the diagram of FIG. 3A the load resistors 100, 101 and 102 are provided in leads which are adapted to feed current into the laser, they may alternatively be arranged on a high resistance Si heat sink 200 as shown in FIG. 4. The semiconductor laser chip of FIG. 2 is interconnected with this structure by fusing patterned wirings 201, 202 to and 203 the first to third p-side electrodes 80, 81 and 82, the wirings 201, 202 and 203 each being 5 μm thick and made of AuSn. The chip resistors 100, 101 and 102 are respectively interconnected by fusing the same to the wirings 201, 202 and 203 and to terminal 204, which is also 5 μm thick and made of AuSn. The terminal 204 electrically interconnects the wirings 201–203 and the terminal bonding wire 301. The chip resistors 100, 101 and 102 are 100Ω, 50Ω and 100Ω in resistance, respectively. Bonding wire 300 is connected to the n-side electrode 83 of the laser. Such a structure makes it possible to form the external load resistors of FIG. 3 in a hybrid configuration on the heat sink 200 of the laser.

Referring to FIG. 5, a third embodiment of the present invention is shown. This embodiment differs from that of FIG. 2 in that a high reflectivity film 31 is deposited by vapor deposition on the rear facet 91 so as to enhance the reflectivity of the facet 91 to 90%. The film 31 has a four-layer configuration, i.e. $SiO_2$/amorphous Si/$SiO_2$/amorphous Si. In the structure shown in FIG. 5, the λ/4-shifted region is needless and, therefore, not formed. As represented by a solid curve in FIG. 6B, a laser with the structure of FIG. 5 exhibits a field intensity distribution which increases toward the high reflectivity facet 1. In this embodiment, the p-side electrode is divided into first and second electrodes 80 and 81. FIG. 6A shows the load resistors 100 and 101 having resistance values 100Ω and 50Ω, respectively, which are respectively connected to the first and the second p-side electrodes 80 and 81, as in the first embodiment. FIG. 6B shows the current density distribution and field intensity distribution attainable with the arrangement of FIG. 6A. It will be seen that the two distributions resemble each other in configuration.

An experiment was conducted with the arrangement of FIG. 6A so as to evaluate the characteristics of the laser; the lasing threshold was measured to be 20 mA, the maximum output of light from the front facet was 120 mW, and the differential quantum efficiency was as great as 60% at maximum at room temperature. A laser having such a structure may be considered to substantially resemble a laser having a λ/4-shifted region thereinside except that the region 50 is relocated to the position of the high reflectivity film 31. The laser of FIG. 5 was found to operate stably in a single mode and most such lasers were proven operable in a stable single mode up to a light output range above 50 mW. Also, it was revealed that with the laser of FIG. 5 it is easy to achieve a high output and a high efficiency characteristic, compared to that of FIG. 2.

Although each of the foregoing embodiments has been shown and described as having two or three fragments of a p-side electrode, such particular numbers are only illustrative. That is, the greater the number of electrode fragments, the more the current distribution configuration matches the field intensity of light inside the laser.

While in the embodiments shown and described so far the electrode is divided in order to control the current distribution configuration, this kind of approach involves the need for troublesome procedures such as interconnecting resistors having different values to the individual electrode pieces. It is therefore desirable to form in a semiconductor chip a structure for controlling the current distribution configuration. This demand may be met by suitably distributing different resistance values along a current path which extends from the electrode to the active layer inside the semiconductor chip. Generally, the resistance value of a semiconductor layer is made variable by changing the carrier density; for example, the specific resistance ρ of a p-InP layer is about 0.1Ω-cm when the carrier density is $1 \times 10^{18}$ $cm^{-3}$ and doubled to about 0.2Ω-cm when it is reduced to $4 \times 10^{17}$ $cm^{-3}$. It follows that where a carrier density distribution is set up in a semiconductor layer along a current path which terminates at an active layer, the value of current which flows through the active layer can be changed even though the electrode on the surface of a semiconductor layer may be the same. Hence, the current which flows toward the active layer may be distributed in correspondence with the field intensity distribution along the axis of a resonator inside the semiconductor laser.

Figure 8A:
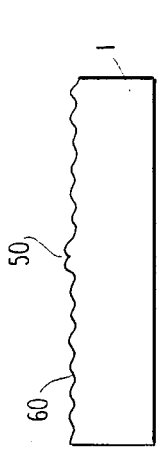
FIGS. 8A to 8D show a basic process for manufacturing the semiconductor laser of FIGS. 7A and 7B.
Figure 8B:
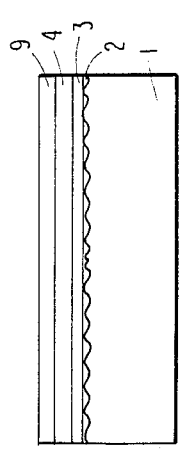
Figure 8C:
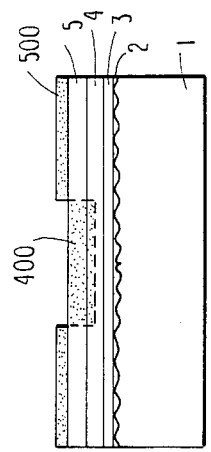
Figure 8D:
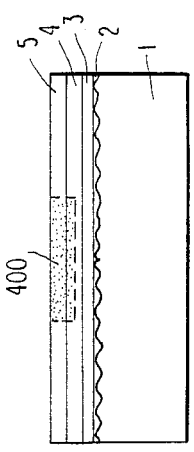
Figure 7A:
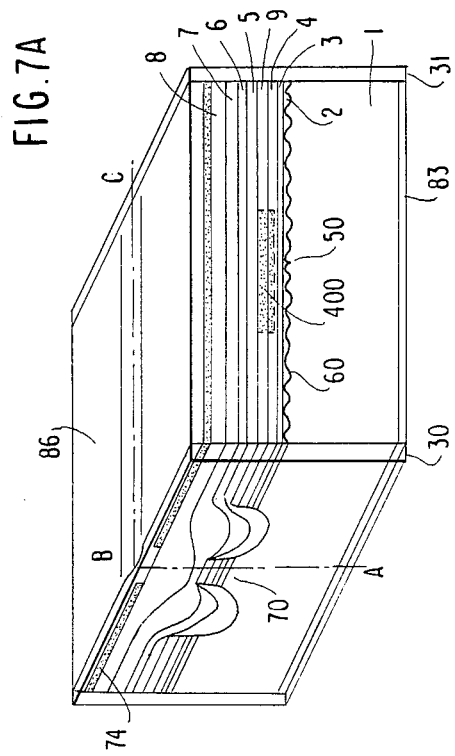
FIG. 7A is a perspective view of a semiconductor laser device usable in a fourth embodiment of the present invention.
Figure 7B:
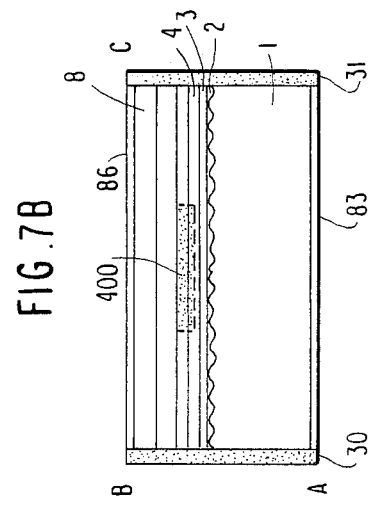
FIG. 7B is a section along line A-B-C of FIG. 7A.

Referring to FIGS. 7A and 7B, a fourth embodiment of the present invention is shown which is derived from the above-described alternative principle. The DFBLD in accordance with this particular embodiment includes a λ/4-shifted region 50, where the period of corrugations is inverted, which is positioned at the center of an n-InP substrate 1. Fundamental steps of a process for manufacturing the DFBLD with such a structure will be described with reference to FIGS. 8A to 8D. First, a diffraction grating 60 is formed on the (001) n-InP substrate 1 (carrier density of $1 \times 10^{18}$ $cm^{-3}$) (FIG. 8A). The diffraction grating is provided at the center thereof with a λ/4-shifted region 50 where the period of corrugations is inverted. The diffraction grating 60 was formed by interference exposure using an He-Cd gas laser whose wavelength was 321 nm. The period of the diffraction grating 60 was 2000 Å and the depth thereof, 800 Å. Then, as shown in FIG. 8B, an n-InGaAsP guide layer 2 (1.15 μm composition in terms of lasing wavelength, 0.1 μm thick in the troughs of the grating 60, Sn-doped, carrier density of $7 \times 10^{17}$ $cm^{-3}$), a nondoped InGaAsP active layer 3 (1.3 μm composition in terms of lasing wavelength, 0.1 μm thick), a p-InP cladding layer 4 (0.5 μm thick, Zn-doped, carrier density of $1 \times 10^{18}$ $cm^{-3}$) and a $p^-$-InP second cladding layer 9 (0.5 μm thick, Zn-doped, carrier density of $4 \times 10^{17}$ $cm^{-3}$) are sequentially formed on the n-InP substrate 1 by liquid phase epitaxy. In this condition, as shown in FIG. 8C, an $SiO_2$ film 500 is formed on the whole surface and, then, partly removed in a 100 μm wide stripe configuration in a direction perpendicular to the sheet surface of FIG. 8C by photolithography. In this condition, Zn is selectively diffused to a depth of about 0.7 μm penetrating the $p^-$-InP second cladding layer 9, thereby forming a low resistance region 400. The carrier density of the low resistance region 400 was found to have increased to $3 \times 10^{18}$ $cm^{-3}$ while the specific resistance of the region 400 was found to have decreased to about 0.04Ω-cm. Then, the $SiO_2$ film 500 is removed by chemical etching, as shown in FIG. 8D. This is followed by forming a double channel planar buried heterostructure as shown in FIG. 7A using the substrate, as has been the case with the embodiment of FIG. 2. A p-side electrode 86 using Cr/Au metal of a current confining structure which is implemented by an $SiO_2$ insulating film is formed on the surface of the p-InGaAsP cap layer 8. An n-side electrode 83 using an AuGeNi metal is formed on the substrate 1 side of the wafer by polishing that side until the total thickness of the wafer decreases to 140

μm. Subsequently, the laminate is cleaved to a resonator length of 300 μm such that the low resistance region 100 is located substantially at the center, whereafter SiN is deposited by vapor deposition on opposite facets to provide low reflectivity films 30 and 31 each having a reflectivity of about 2%.

FIG. 7B is a section along line A-B-C of FIG. 7A, specifically along substantially the center of the mesa stripe 70, and representative of an emitting portion of the active layer 3. When the p-side electrode 86 was biased to the positive polarity and the n-side to the negative polarity and current was injected into the active layer 3, the laser oscillated at a threshold of 20 mA. Light outputs from the front and rear facets were found to be substantially equal to each other, and the differential quantum efficiency of the sum of light emitted from the opposite facets was 60%. As regards the lasing spectrum, the wavelength in a single mode was measured to be 1.305 μm. The injection current versus light output characteristic was free from kinks otherwise brought about by mode hopping and other causes; stable single mode operation was maintained up to a high output range above 40 mW.

Moreover, more than 70% of such laser chips exhibited stable single mode operation.

Presumably, the desirable chip characteristics as well as high yield are accounted for by the following reason. In FIG. 7B, where current is fed with the p-side electrode 86 and the n-side electrode 83 biased to the positive and the negative, respectively, the specific resistance of the $p^-$-InP second cladding layer is about 0.04Ω-cm in the low resistance region 400 but about 0.2Ωcm in the other region, a difference of about a factor of five. In this condition, the current flowing into the active layer 3 is distributed in a configuration similar to that which is represented by the broken line in FIG. 3B, the current density distribution therefore being similar to the field intensity distribution. Hence, even if the injected current is increased, the mode which exhibits the field intensity distribution as represented by the solid line of FIG. 3B lases stably, while the other modes which have different distributions hardly lase at all. This presumably is the reason why laser chips which operate in a stable single mode can be manufactured with good reproducibility and uniformity.

In the embodiment of FIG. 7A, the low resistance region 400 is located at the center of the element. If desired, the λ/4-shifted region 50 may be omitted and the reflectivity of the SiN reflective film 31 on the right-hand side may be increased to 90%, in which case the region 400 needs to be located in the vicinity of the end face at the right-hand side because the field intensity along the resonator inside the laser would increase toward the right end facet. Selective diffusion of Zn as used in the foregoing embodiments to form the particular region 400 may be replaced with any other suitable implementation such as an ion injection of Be or the like. While the cladding layer has been shown and described as being made up of a low resistance layer and a high resistance layer, such is only illustrative. For example, the cladding layer may be comprised of a low resistance layer only and an impurity compensating region may be formed in a region adjacent to the light emitting facet, for the purpose of enhancing the resistance and setting up a resistance region which is distributed along the resonator. Further, the buried stripe structure shown and described is not limitative and may be replaced by any other suitable stripe structure without impairing the effects. Stated another way, the stripe structure does not constitute an essential part of the present invention.

What is claimed is:

1. A semiconductor laser device comprising:
   an active layer for emitting light in response to the injection of current;
   a diffraction grating disposed at least substantially adjacent to said active layer, for interacting with said light;
   current injecting means for injecting current into said active layer; and
   control means for controlling the distribution of the current injected into said active layer such that said current distribution approximates a field intensity distribution of light in the direction of the laser optical axis inside said active layer.

2. A semiconductor laser device as claimed in claim 1, wherein said current injecting means comprises positive and negative electrodes, that one of said positive and negative electrodes which is closer to said active layer comprising a plurality of separated individual electrodes.

3. A semiconductor laser device as claimed in claim 2, wherein load resistors are connected to each of said individual electrodes.

4. A semiconductor laser device as claimed in claim 3, wherein said individual electrodes are interconnected by fusing the same to a like number of wirings, said wirings in turn being individually fused to said load resistors, said load resistors being additionally fused to a terminal provided on a heat sink.

5. A semiconductor laser derive as claimed in claim 1, wherein said semiconductor laser device includes a cladding layer which neighbors said active layer and which is greater in bandgap than said active layer, said cladding layer having a resistivity which varies in the direction of the laser optical axis and in correspondence with the field intensity distribution of light.

6. A semiconductor laser device as claimed in claim 1, wherein said diffraction grating includes a phase shifted region where a phase of said diffraction grating is shifted by a quarter-wave.

7. A semiconductor laser device as claimed in claim 6, wherein opposite ends of said active layer are provided with a reflective film of low reflectivity.

8. A semiconductor laser derice as claimed in claim 1, wherein one of said opposite ends of said active layer is provided with a reflective film of high reflectivity and the other end is provided with a reflective film of low reflectivity.

9. A semiconductor laser as claimed in claim 1, wherein said current injecting means comprises at least two separated electrode surfaces formed over or under said active layer, and wherein said control means comprises resistances electrically connected to said separated electrode surfaces, said resistances being varied in resistivity so as to selectively vary the current density distribution within said active layer.

10. A semiconductor laser as claimed in claim 8, wherein said current injecting means comprises at least two separated electrode surfaces formed over or under said active layer, and wherein said control means comprises resistances electrically connected to said separated electrode surfaces, said resistances being varied in resistivity so as to selectively vary the current density distribution within said active layer.

11. A semiconductor laser as claimed in claim 1, wherein said control means comprises at least one cladding layer adjacent said active layer, said cladding layer including at least one region having a carrier density substantially varied from the carrier density exhibited by other regions of said cladding layer.

12. A semiconductor laser as claimed in claim 11, wherein said at least one region comprises a region including a diffused impurity in a sufficient concentration to materially lower the resistivity of the same.

* * * * *

UNITED STATES PATENT AND TRADEMARK OFFICE
CERTIFICATE OF CORRECTION

PATENT NO.   : 4,751,719
DATED        : June 14, 1988
INVENTOR(S)  : MITO ET AL

It is certified that error appears in the above-identified patent and that said Letters Patent is hereby corrected as shown below:

Column 1, line 14, after "communications" insert a period (.).
Column 1, line 20, delete "100kg" insert --100km--.
Column 2, line 30, delete "exmple" insert --example--.
Column 2, line 53, delete "semiconductor" insert --resonator--.
Column 5, line 29, delete "1" insert --31--.

Signed and Sealed this

Tenth Day of January, 1989

Attest:

DONALD J. QUIGG

*Attesting Officer*      Commissioner of Patents and Trademarks